(12) United States Patent
Kuga et al.

(10) Patent No.: US 12,374,662 B2
(45) Date of Patent: Jul. 29, 2025

(54) SEMICONDUCTOR POWER MODULE AND POWER CONVERSION APPARATUS

(71) Applicant: Mitsubishi Electric Corporation, Tokyo (JP)

(72) Inventors: Ren Kuga, Tokyo (JP); Nobuchika Aoki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 484 days.

(21) Appl. No.: 18/047,597

(22) Filed: Oct. 18, 2022

(65) Prior Publication Data

US 2023/0197691 A1 Jun. 22, 2023

(30) Foreign Application Priority Data

Dec. 17, 2021 (JP) .................................. 2021-204953

(51) Int. Cl.
*H01L 25/07* (2006.01)
*H01L 23/00* (2006.01)
(Continued)

(52) U.S. Cl.
CPC .......... *H01L 25/072* (2013.01); *H01L 23/049* (2013.01); *H01L 24/48* (2013.01); *H01L 25/18* (2013.01); *H01L 2224/48137* (2013.01); *H01L 2224/48155* (2013.01); *H01L 2924/10253* (2013.01); *H01L 2924/10272* (2013.01); *H01L 2924/1033* (2013.01); *H01L 2924/1203* (2013.01); *H01L 2924/13055* (2013.01); *H02P 27/06* (2013.01)

(58) Field of Classification Search
None
See application file for complete search history.

(56) References Cited

U.S. PATENT DOCUMENTS

| 2013/0155745 | A1* | 6/2013 | Tanaka | H02M 7/537 |
| | | | | 363/131 |
| 2015/0084173 | A1* | 3/2015 | Zhang | H01L 23/4334 |
| | | | | 257/676 |

(Continued)

FOREIGN PATENT DOCUMENTS

JP 2015-154079 A 8/2015

*Primary Examiner* — Sue A Purvis
*Assistant Examiner* — Jordan M Klein
(74) *Attorney, Agent, or Firm* — Studebaker Brackett PLLC

(57) ABSTRACT

A semiconductor power module in which a three-phase AC inverter is incorporated in a package includes first to third circuit patterns on which second, fourth, and sixth switching elements are mounted, respectively, and a fourth circuit pattern on which first, third, and fifth switching elements are mounted; a second main electrode to which all of main electrode wirings of the second, fourth, and sixth switching elements are connected; a second main electrode terminal connected to the second main electrode; a first main electrode electrically connected to the fourth circuit pattern; and a first main electrode terminal connected to the first main electrode, and each of the main electrode wirings of the second, fourth, and sixth switching elements is provided so that a main electrode wiring closer to the second main electrode terminal in a horizontal direction in plan view has a longer length.

8 Claims, 14 Drawing Sheets

(51) Int. Cl.
    *H01L 23/049*     (2006.01)
    *H01L 25/18*     (2023.01)
    *H02P 27/06*     (2006.01)

(56) References Cited

U.S. PATENT DOCUMENTS

2015/0237727 A1*   8/2015   Spang ................. H01L 23/3735
                                                                                   361/767
2018/0131262 A1*   5/2018   Yamaguchi ............. H01L 23/28

* cited by examiner

F I G. 2
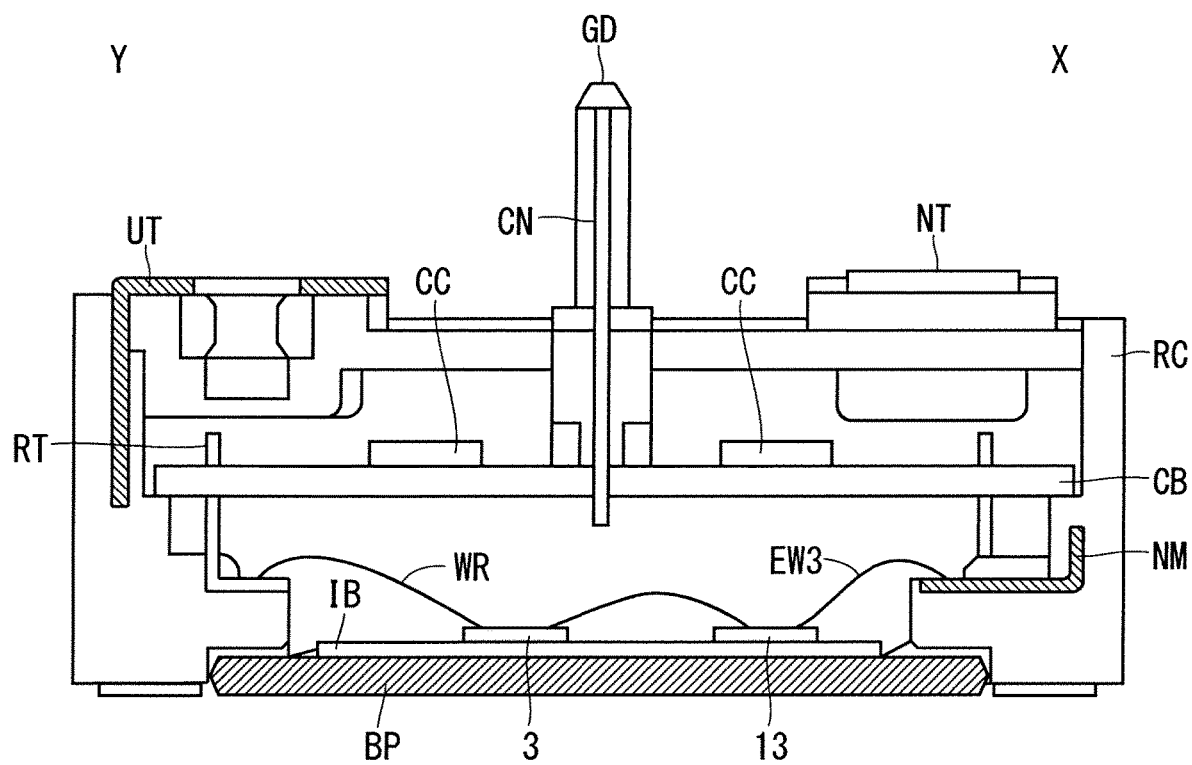

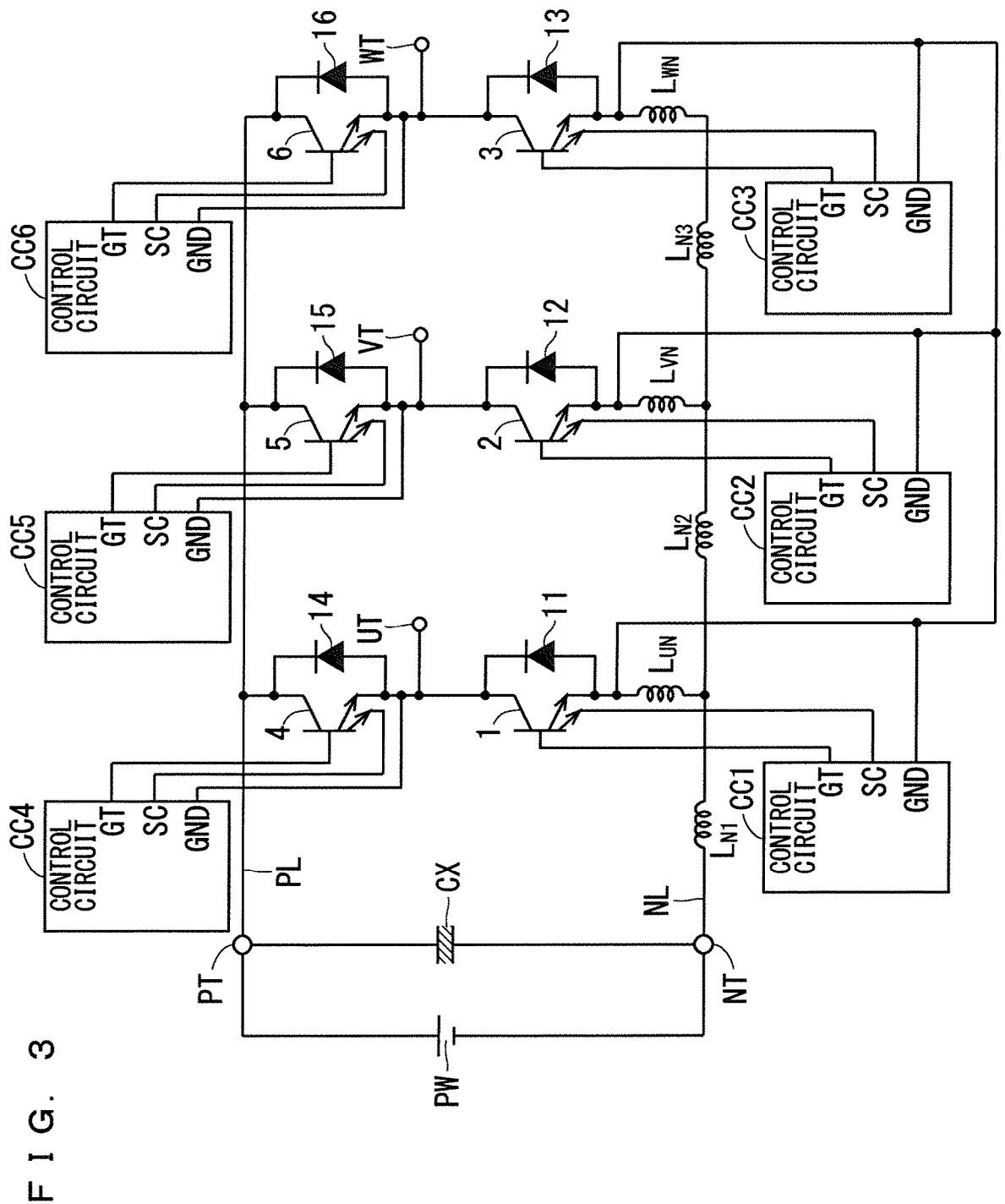
F I G. 3

F I G. 9
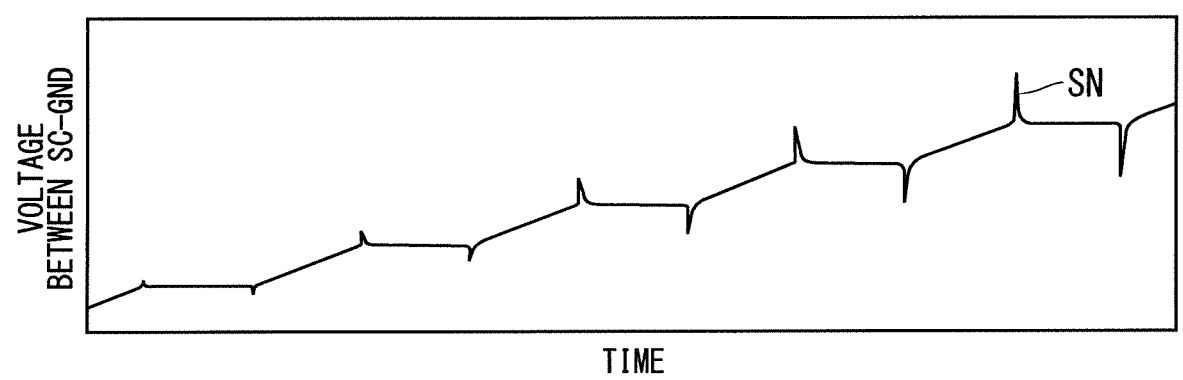

F I G. 1 0
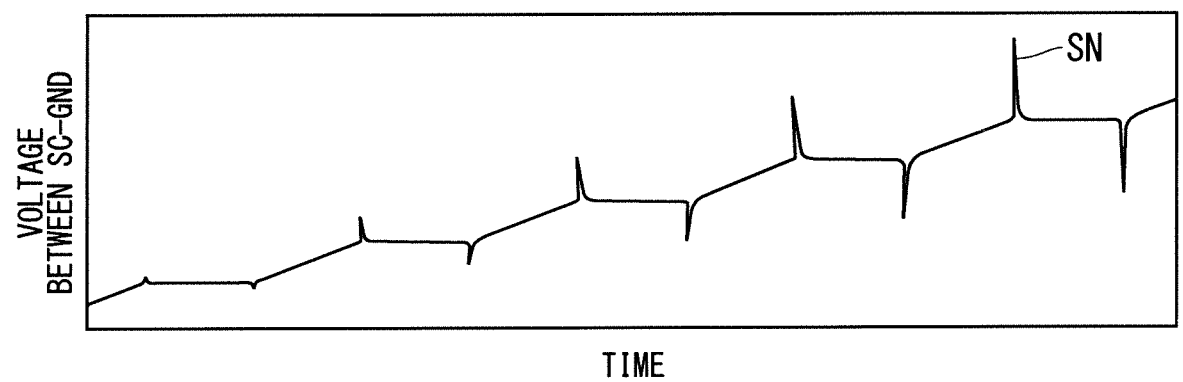

SEMICONDUCTOR POWER MODULE AND POWER CONVERSION APPARATUS

BACKGROUND OF THE INVENTION

Field of the Invention

The present disclosure relates to a semiconductor power module, and particularly to a semiconductor power module that is improved in accuracy of overcurrent protection.

Description of the Background Art

For example, Japanese Patent Application Laid-Open No. 2015-154079 discloses a connection method using wire bonding that uniformly achieves low inductance in a semiconductor power module having a plurality of transistor chips connected in parallel.

The technique disclosed in Japanese Patent Application Laid-Open No. 2015-154079 is directed to a semiconductor power module in which a plurality of transistor chips are connected in parallel on a same circuit pattern, and is not directed to a semiconductor power module in which a three-phase AC inverter is incorporated in a same package.

In a case where a three-phase AC inverter is incorporated in a same package, there is a problem that emitter electrodes are connected to a common N terminal, and a power module is shut off earlier than a specified value at a time of overcurrent protection operation due to a difference in wiring inductance among the emitter electrodes connected to the common N terminal when a load current flows.

The present disclosure has been made to solve the above problem, and an object of the present disclosure is to provide a semiconductor power module that is improved in accuracy of overcurrent protection.

SUMMARY

A semiconductor power module according to the present disclosure includes a three-phase AC inverter incorporated in a package, wherein the three-phase AC inverter includes: a first switching element and a second switching element connected in series, a third switching element and a fourth switching element connected in series, and a fifth switching element and a sixth switching element connected in series between a first main power supply line to which a first potential is applied and a second main power supply line to which a second potential lower than the first potential is applied, and a first freewheeling element, a second freewheeling element, a third freewheeling element, a fourth freewheeling element, a fifth freewheeling element, and a sixth freewheeling element connected in anti-parallel to the first to sixth switching elements, respectively, the semiconductor power module includes: a first circuit pattern, a second circuit pattern, a third circuit pattern on which the second, the fourth, and the sixth switching elements are mounted, respectively, and a fourth circuit pattern on which the first, the third, and the fifth switching elements are mounted; a second main electrode to which all of main electrode wirings of the second, the fourth, and the sixth switching elements are connected; a second main electrode terminal connected to the second main electrode; a first main electrode electrically connected to the fourth circuit pattern; and a first main electrode terminal connected to the first main electrode, a first die pad, a second die pad, and a third die pad on which the second, the fourth, and the sixth switching elements of the first to third circuit patterns are mounted are arranged in a line in a direction along one side of the package so as to be parallel to each other, and the second main electrode is provided to extend along the one side, and the second main electrode terminal is provided at an end portion of the second main electrode in a direction in which the second main electrode extends in plan view, and each of the main electrode wirings of the second, the fourth, and the sixth switching elements is provided so that a main electrode wiring closer to the second main electrode terminal in a horizontal direction in plan view has a longer length.

According to the semiconductor power module according to the present disclosure, the main electrode wirings of the second, the fourth, and the sixth switching elements are provided so that a main electrode wiring closer to the second main electrode terminal in a horizontal direction in plan view has a longer length. Accordingly, magnitudes of wiring inductances of the second, the fourth, and the sixth switching elements to the second main electrode can be made uniform. As a result, a semiconductor power module that is improved in accuracy of overcurrent protection can be obtained.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 2 is a cross-sectional view illustrating a configuration of the semiconductor power module according to the first preferred embodiment;

FIG. 3 is a diagram illustrating a circuit configuration of the semiconductor power module;

FIG. 9 illustrates a simulation result of a spike-like noise voltage;

FIG. 10 illustrates a simulation result of a spike-like noise voltage;

DESCRIPTION OF THE PREFERRED EMBODIMENTS

First Preferred Embodiment

Figure 1:
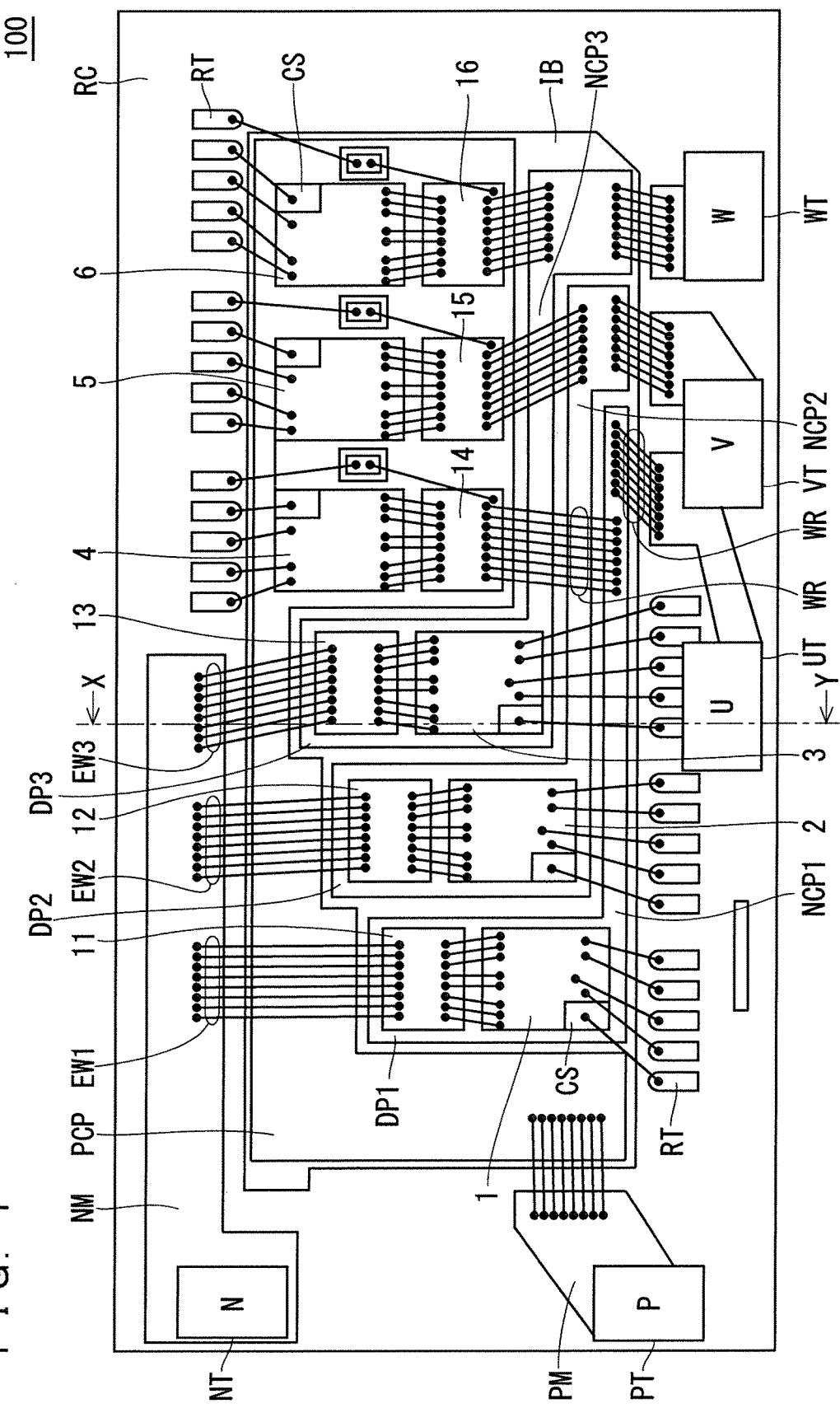
FIG. 1 is a plan view illustrating a configuration of a semiconductor power module according to a first preferred embodiment.

FIG. 1 is a plan view illustrating a configuration of a semiconductor power module 100 according to a first preferred embodiment of the present disclosure, and FIG. 2 is a cross-sectional view in the direction of the arrow taken along line X-Y in FIG. 1. In FIG. 1, for convenience of illustration, an upper structure of a resin case RC is omitted so that a circuit pattern can be visually observed. In FIG. 2, for convenience of illustration, a sealing resin that fills the resin case RC is omitted.

As illustrated in FIG. 2, in semiconductor power module 100, an insulating substrate IB is mounted on a base plate BP forming a bottom surface of the resin case RC.

As illustrated in FIG. 1, a plurality of circuit patterns are provided on the insulating substrate IB. Specifically, a P-side collector circuit pattern PCP, N-side collector circuit patterns NCP1, NCP2, and NCP3 are provided.

On the P-side collector circuit pattern PCP, transistor chips 4, 5, and 6 and diode chips 14, 15, and 16 are mounted. On the N-side collector circuit pattern NCP1, a transistor chip 1 and a diode chip 11 are mounted. On the N-side collector circuit pattern NCP2, a transistor chip 2 and a diode chip 12 are mounted. On the N-side collector circuit pattern NCP3, a transistor chip 3 and a diode chip 13 are mounted.

Both an emitter of the transistor chip 4 and an anode of the diode chip 14 are connected to the N-side collector circuit pattern NCP1 by a wire WR, both an emitter of the transistor chip 5 and an anode of the diode chip 15 are connected to the N-side collector circuit pattern NCP2 by a wire WR, and both an emitter of the transistor chip 6 and an anode of the diode chip 16 are connected to the N-side collector circuit pattern NCP3 by a wire WR.

The N-side collector circuit pattern NCP1 is electrically connected to a U terminal UT by a wire WR, the N-side collector circuit pattern NCP2 is electrically connected to a V terminal VT by a wire WR, and the N-side collector circuit pattern NCP3 is electrically connected to a W terminal WT by a wire WR. Note that the U terminal UT, the V terminal VT, and the W terminal WT are exposed in the upper structure of the resin case RC.

Both an emitter of the transistor chip 1 and an anode of the diode chip 11 are connected to an N-side main electrode NM by an emitter wire EW1, both an emitter of the transistor chip 2 and an anode of the diode chip 12 are connected to the N-side main electrode NM by an emitter wire EW2, both an emitter of the transistor chip 3 and an anode of the diode chip 13 are connected to the N-side main electrode NM by an emitter wire EW3, and the N-side main electrode NM is exposed as an N terminal NT of the semiconductor power module 100 in the upper structure of the resin case RC.

The P-side collector circuit pattern PCP is connected to a P-side main electrode PM by a wire WR, and the P-side main electrode PM is exposed as a P terminal PT of the semiconductor power module 100 in the upper structure of the resin case RC.

Note that sense current terminals CS are provided on surfaces on an emitter side of the transistor chips 1 to 6, and are electrically connected to relay terminals RT by wires WR.

Furthermore, each of gate terminals (not illustrated) is provided on surfaces on an emitter side of the transistor chips 1 to 6, and is electrically connected to relay terminals RT by wires WR.

As illustrated in FIG. 2, the relay terminal RT is electrically connected to a control circuit CC mounted on a control board CB provided on the insulating substrate IB in the semiconductor power module 100, and supplies a gate signal output from the control circuit CC to the transistor chip and supplies a sense current output from the sense current terminal CS to the control circuit CC.

Furthermore, as illustrated in FIG. 2, the upper structure of the resin case RC is provided with a plurality of connectors CN for exchanging electrical signals between the control board CB and an outside during manufacturing, and a guide pin GD for improving insertability of an external connector is provided on both sides of arrangement of the plurality of connectors CN.

FIG. 3 is a diagram illustrating a circuit configuration of the semiconductor power module 100. As illustrated in FIG. 3, the transistor chip 4 and the transistor chip 1 are connected in series, the transistor chip 5 and the transistor chip 2 are connected in series, and the transistor chip 6 and the transistor chip 3 are connected in series between a main power supply line PL connected to a P terminal PT on a high potential side (P side) connected to a positive electrode of a power supply PW and a main power supply line NL connected to an N terminal NT on a low potential side (N side) connected to a negative electrode of the power supply PW. A smoothing capacitor CX is connected in parallel to the power supply PW. Note that the power supply PW is not incorporated in the semiconductor power module 100 but is provided outside the module, and is supplied with DC power from the outside via the P terminal PT and the N terminal NT.

A connection node between the transistor chip 4 and the transistor chip 1 is the U terminal UT that outputs a U phase, a connection node between the transistor chip 5 and the transistor chip 2 is the V terminal VT that outputs a V phase, a connection node between the transistor chip 6 and the transistor chip 3 is the W terminal WT that outputs a W phase, and the transistor chips 1 to 6 constitute a three-phase AC inverter.

The diode chips 11 to 16 are connected in anti-parallel to the transistor chips 1 to 6, respectively.

The transistor chips 1 to 6 are controlled by control circuits CC1, CC2, CC3, CC4, CC5, and CC6, respectively, and for example, a gate signal is output from a gate terminal GT of the control circuit CC4 and input to a gate of the transistor chip 4. Furthermore, a sense current is input from the sense current terminal CS (FIG. 1) of the transistor chip 4 to a current sense terminal SC of the control circuit CC4. A reference potential terminal GND of the control circuit CC4 is connected to the U terminal UT.

As illustrated in FIG. 1, in the semiconductor power module 100, the emitter wires EW1, EW2, and EW3 of the transistor chips 1 to 3 that are different in collector potential are configured such that an emitter wire closer to the N terminal NT in a horizontal direction has a longer length. That is, the N-side collector circuit patterns NCP1, NCP2, and NCP3 are arranged in a line such that die pads DP1, DP2, and DP3 on which the transistor chips and the diode chips are mounted are parallel to each other, and an arrangement direction thereof is a direction along a long side of the resin case RC having a rectangular shape in plan view. The die pads DP1 to DP3 of the N-side collector circuit patterns NCP1, NCP2, and NCP3 are provided so as to be shifted from each other. That is, an end of the die pad DP1 on an N-side main electrode NM side is provided at a position farthest from the N-side main electrode NM, an end of the die pad DP3 on the N-side main electrode NM side is provided at a position closest to the N-side main electrode NM, and an end of the die pad DP2 on the N-side main electrode NM side is provided at a position between the die pad DP1 and the die pad DP3. In other words, the die pads DP1 to DP3 are provided in a shape of steps that descend toward the N terminal NT in plan view.

The N-terminal NT and the P-terminal PT are provided along one short side of the resin case RC, and the N-side main electrode NM extends along one long side of the resin case RC, is bent in a side wall on the one short side of the resin case RC (FIG. 2), and is exposed in the upper structure of the resin case RC. Accordingly, in plan view, the emitter wires EW1, EW2, and EW3 are arranged in a line with respect to the N terminal NT, and are configured such that an emitter wire closer to the N terminal NT in the horizontal direction, that is, in a direction parallel to the long side of the resin case RC has a longer length. More specifically, the length of the emitter wire EW1 closest to the N terminal NT is longest, and the length of the emitter wire EW3 farthest from the N terminal NT is shortest.

By providing the N terminal NT and the P terminal PT adjacent to each other along the one short side of the resin case RC, inductances of the N-side main electrode NM and the P-side main electrode can be reduced, and a surge voltage can be suppressed.

As described above, by arranging the die pads DP1 to DP3 in a shape of steps that descend toward the N terminal NT in plan view, a wire length of an emitter wire closer to the N terminal NT in the horizontal direction can be made longer. This can make parasitic inductances uniform and make wiring inductances the same, thereby improving accuracy of overcurrent protection.

A mechanism for improving the accuracy of overcurrent protection will be described below. First, the sense current terminal CS provided on each transistor chip is connected to the current sense terminal SC of the control circuit CC on the control board CB (FIG. 2) via a relay terminal RT by a wire WR.

The current sense terminal SC is provided to detect an overcurrent and a short-circuit current, and monitors a voltage between SC and GND. When a minute current proportional to the collector current, for example, a sense current that is about 1/10000 of the collector current flows through the sense current terminals CS (FIG. 1) provided on the transistor chips 1 to 6, the voltage between SC and GND increases. When the voltage between SC and GND reaches a threshold, an overcurrent protection function of the control circuit CC is activated. Since overcurrent protection is applied, the overcurrent can be cut off before the semiconductor power module 100 is broken at the time of overcurrent.

As illustrated in FIG. 3, parasitic inductances are present in the main power supply line NL, that is, the N-side main electrode NM (FIG. 1), and the parasitic inductances of the N-side main electrode NM are $L_{N1}$, $L_{N2}$, and $L_{N3}$ from a side closer to the N terminal NT, and parasitic inductances of the N-side emitter wire EW1, emitter wire EW2, and emitter wire EW3 are $L_{UN}$, $L_{VN}$, and $L_{WN}$, respectively.

Figure 4:
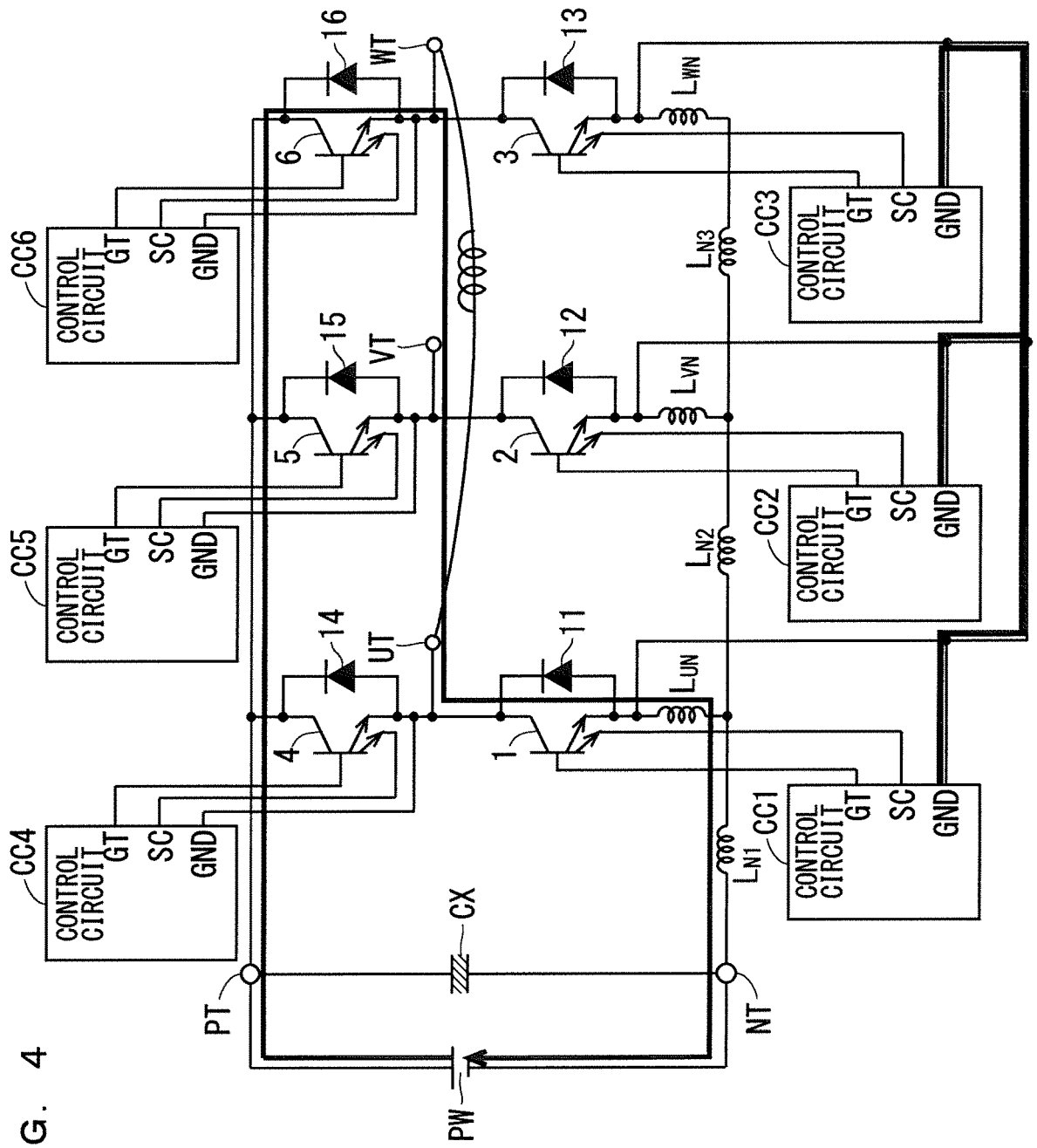
FIG. 4 is a diagram illustrating an H-bridge circuit simulating inverter operation of a three-phase AC inverter of the semiconductor power module.
Figure 5:
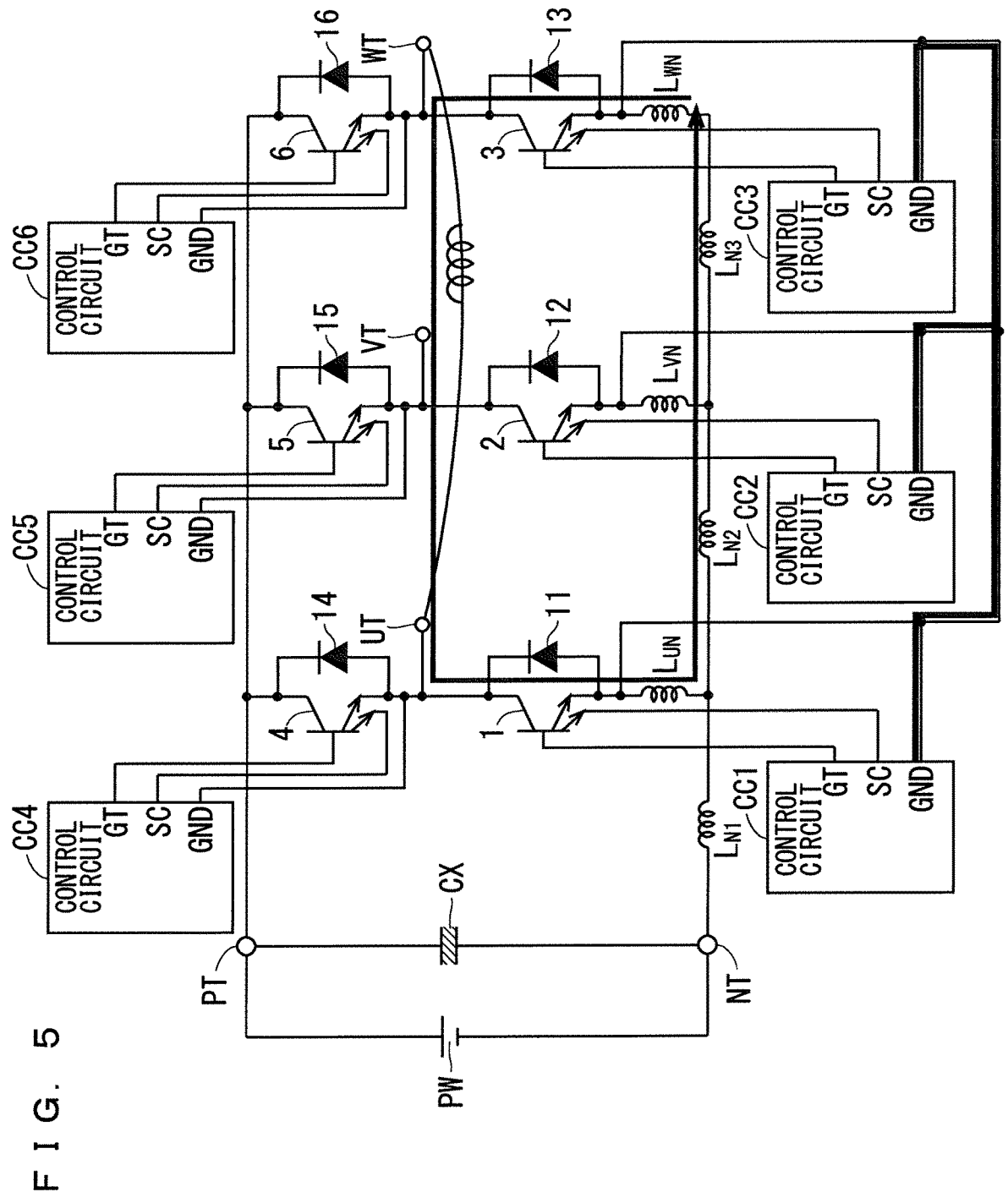
FIG. 5 is a diagram illustrating an H-bridge circuit simulating inverter operation of a three-phase AC inverter of the semiconductor power module.

Next, an H-bridge circuit simulating inverter operation of the three-phase AC inverter of the semiconductor power module 100 is illustrated in FIGS. 4 and 5.

In FIG. 4, the arrow indicates a current path in a case where the transistor chip 6 on the P-side and the transistor chip 1 on the N-side are energized (turned on), and the thick solid line indicates that the reference potential terminal GND on the N side on the control board CB is common. This pattern in which the reference potential terminal GND is common is referred to as a GND pattern of an N-side emitter. Although a current path passing the U terminal UT, the V terminal VT, and the W terminal WT is illustrated in FIG. 4, this is a current path passing an external inductive load (not illustrated) connected to the terminals.

In FIG. 5, the arrow indicates a freewheeling current path in a case where energization of the transistor chip 6 is stopped after causing the three-phase AC inverter to operate in the current path of FIG. 4, and the thick solid line indicates that the reference potential terminal GND on the N side on the control board CB (FIG. 2) is common.

When energization of the transistor chip 6 is stopped after causing the three-phase AC inverter to operate in the current path of FIG. 4, a freewheeling current illustrated in FIG. 5 is generated. At this time, a potential difference is generated in the GND pattern of the N-side emitter on the control board CB due to influence of the parasitic inductances $L_{N2}$, $L_{N3}$, and $L_{WN}$ present on the energizing path of the freewheeling current, and a spike-like noise voltage is generated between SC and GND of the control circuit CC1 connected to the transistor chip 1.

Figure 6:
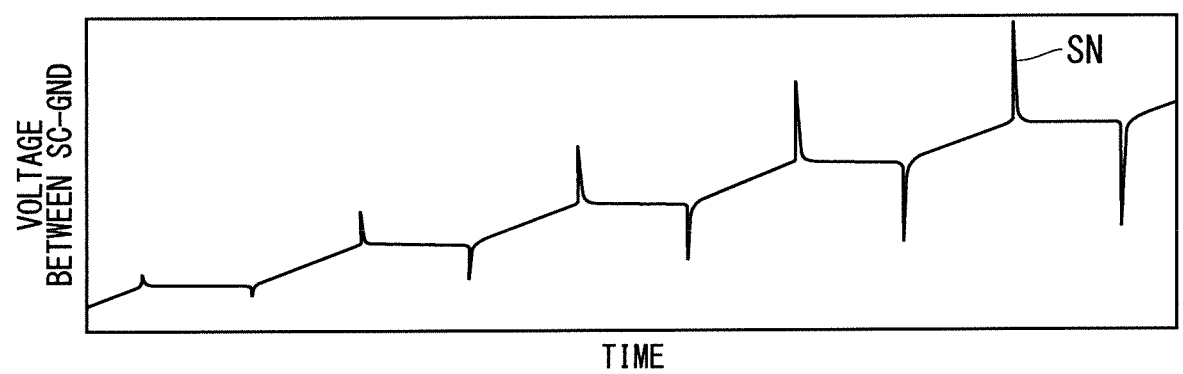
FIG. 6 illustrates a simulation result of a spike-like noise voltage.

FIG. 6 illustrates a simulation result of this spike-like noise voltage. In FIG. 6, the horizontal axis represents time (arbitrary unit), and the vertical axis represents a voltage between SC and GND (arbitrary unit). FIG. 6 shows that a spike-like noise voltage SN is periodically generated. As a simulation condition, it is assumed that the lengths of the emitter wires EW1, EW2, and EW3 illustrated in FIG. 1 are all equal, and the parasitic inductances $L_{UN}$, $L_{VN}$, and $L_{WN}$ are set to the same value.

Figure 7:
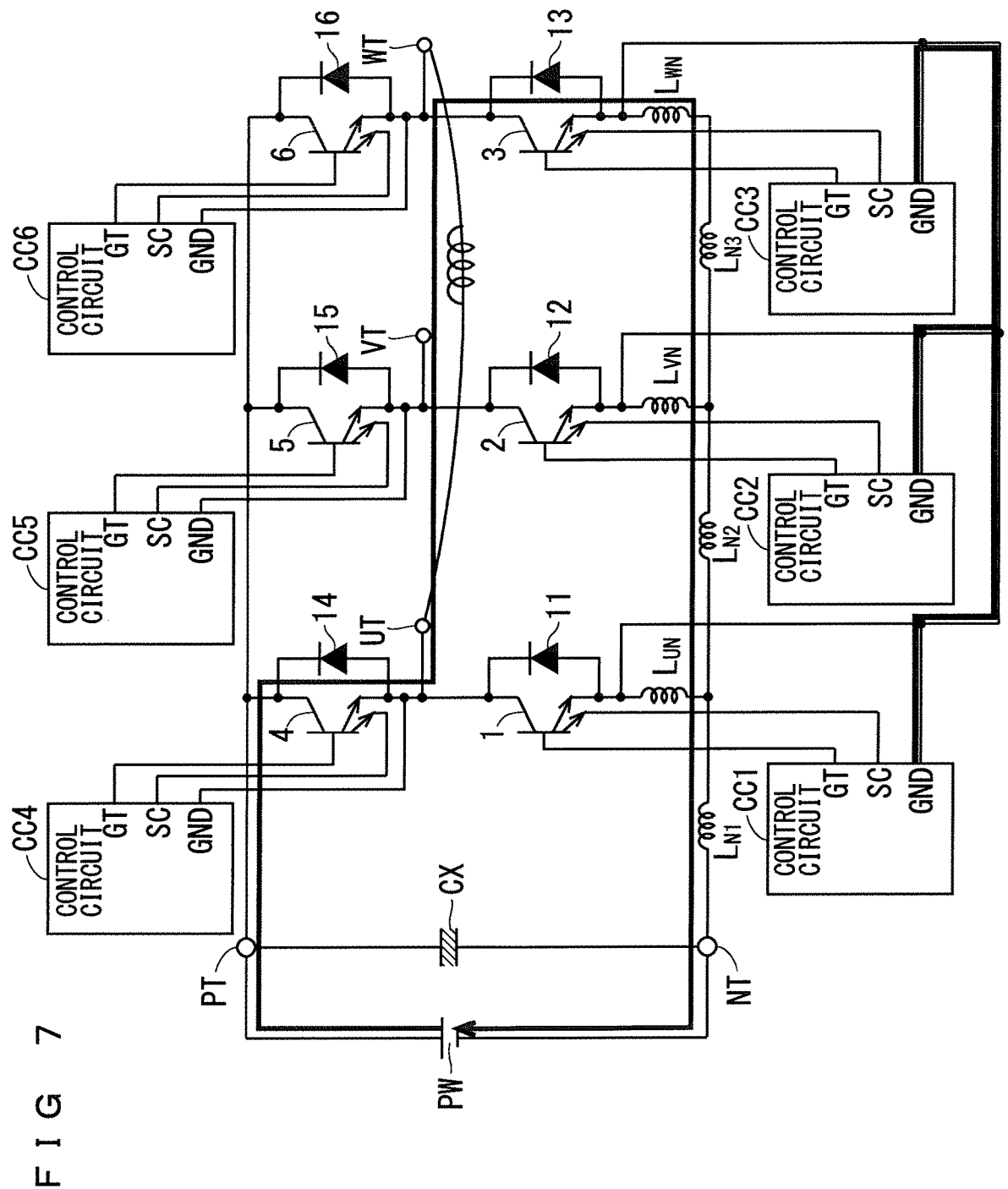
FIG. 7 is a diagram illustrating an H-bridge circuit simulating inverter operation of a three-phase AC inverter of the semiconductor power module.
Figure 8:
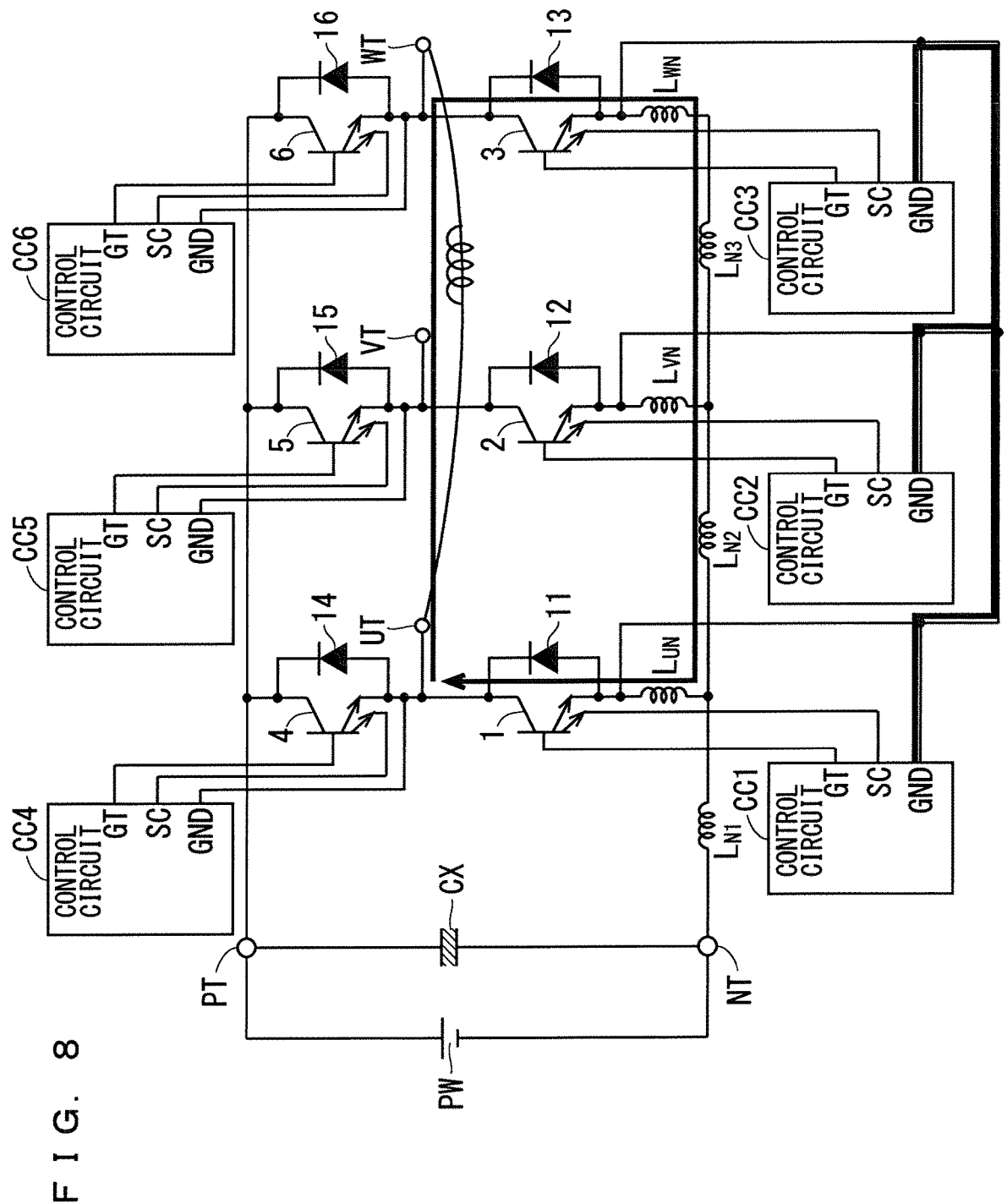
FIG. 8 is a diagram illustrating an H-bridge circuit simulating inverter operation of a three-phase AC inverter of the semiconductor power module.

The generation of the spike-like noise voltage induces malfunction of overcurrent protection in the control circuit. The magnitude of the spike-like noise voltage depends on parasitic inductance of the energizing path at the time of freewheeling. FIGS. 7 and 8 illustrate an H-bridge circuit simulating inverter operation similar to that in FIGS. 4 and 5.

In FIG. 7, the arrow indicates a current path in a case where the transistor chip 4 on the P-side and the transistor chip 3 on the N-side are energized (turned on), and the thick solid line indicates that the reference potential terminal GND on the N side on the control board CB is common.

In FIG. 8, the arrow indicates a freewheeling current path in a case where energization of the transistor chip 4 is stopped after causing the three-phase AC inverter to operate in the current path of FIG. 7, and the thick solid line indicates that the reference potential terminal GND on the N side on the control board CB (FIG. 2) is common.

When energization of the transistor chip 4 is stopped after causing the three-phase AC inverter to operate in the current path of FIG. 7, a freewheeling current illustrated in FIG. 8 is generated. At this time, a potential difference is generated in the GND pattern of the N-side emitter on the control board CB due to influence of the parasitic inductance $L_{UN}$ present on the energizing path of the freewheeling current, and a spike-like noise voltage is generated between SC and GND of the control circuit CC3 connected to the transistor chip 3.

FIG. 9 illustrates a simulation result of this spike-like noise voltage. In FIG. 9, the horizontal axis represents time (arbitrary unit), and the vertical axis represents a voltage between SC and GND (arbitrary unit). FIG. 9 shows that a spike-like noise voltage SN is periodically generated. As a simulation condition, it is assumed that the lengths of the emitter wires EW1, EW2, and EW3 illustrated in FIG. 1 are all equal, and the parasitic inductances $L_{UN}$, $L_{VN}$, and $L_{WN}$ are set to the same value. Since the simulation result of FIG. 9 is a result influenced only by the parasitic inductance $L_{UN}$, a height of the spike-like noise voltage SN is lower than that in the simulation result of FIG. 6. Since a significant difference occurs in the spike-like noise voltage depending on a value of influencing parasitic inductance, there occurs a variation in accuracy of overcurrent protection.

In this respect, as described with reference to FIG. 1, in the semiconductor power module 100 according to the first preferred embodiment, the emitter wires EW1, EW2, and EW3 of the transistor chips 1 to 3 have lengths such that an emitter wire closer to the N terminal NT in the horizontal direction has a longer length, and as a result, the parasitic inductances have the following relationship: $L_{UN} > L_{VN} > L_{WN}$.

FIG. 10 illustrates a simulation result of a spike-like noise voltage generated between SC and GND of the control circuit CC1 connected to the transistor chip 1 in a case where the freewheeling current path of FIG. 5 is formed in a case where energization of the transistor chip 6 is stopped after causing the three-phase AC inverter to operate in the current path of FIG. 4. Although the spike-like noise voltage SN is periodically generated also in FIG. 10, the height of the spike-like noise voltage SN is lower than that in the simulation result illustrated in FIG. 6.

Figure 11:
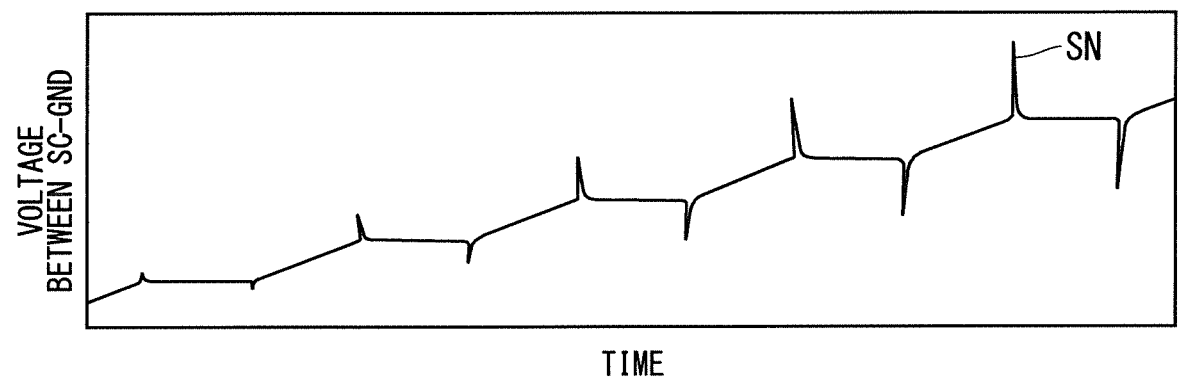
FIG. 11 illustrates a simulation result of a spike-like noise voltage.

FIG. 11 illustrates a simulation result of a spike-like noise voltage generated between SC and GND of the control circuit CC3 connected to the transistor chip 3 in a case where the freewheeling current path of FIG. 7 is formed in a case where energization of the transistor chip 4 is stopped after causing the three-phase AC inverter to operate in the current path of FIG. 7. Although the spike-like noise voltage SN is periodically generated also in FIG. 11, the height of the spike-like noise voltage SN is similar to that in the simulation result illustrated in FIG. 10. The spike-like noise voltages between SC and GND of the control circuits CC1 to CC3 connected to the transistor chips 1 to 3 can be thus made uniform, and thereby accuracy of overcurrent protection of the transistor chips 1 to 3 can be improved.

Note that the simulation condition of the simulation results illustrated in FIGS. 10 and 11 is that values of the parasitic inductances are set to have a relationship of $L_{UN} = L_{VN} + L_{N2} = L_{WN} + L_{N2} + L_{N3}$, and is thus made equivalent to setting the lengths of the emitter wires EW1, EW2, and EW3 of the transistor chips 1 to 3 so that an emitter wire closer to the N terminal NT in the horizontal direction has a longer length.

Furthermore, as rating of the semiconductor power module 100, an output current of 10 A to 500 A and an output voltage of 600 V to 1700 V are assumed.

Second Preferred Embodiment

Figure 12:
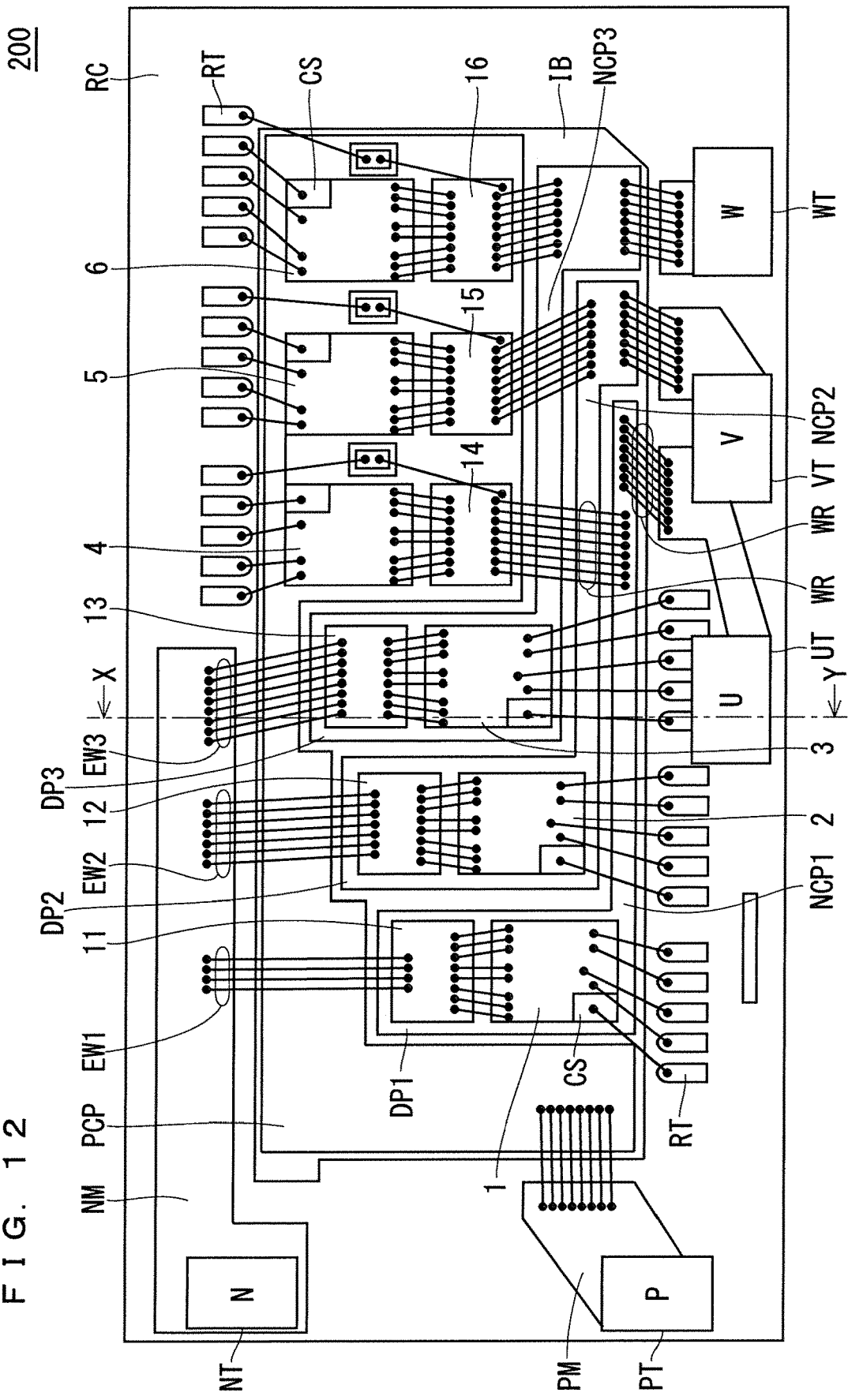
FIG. 12 is a plan view illustrating a configuration of a semiconductor power module according to a second preferred embodiment.

FIG. 12 is a plan view illustrating a configuration of a semiconductor power module 200 according to a second preferred embodiment of the present disclosure. Constituent elements identical to those of the semiconductor power module 100 according to the first preferred embodiment illustrated in FIG. 1 are given identical reference signs, and repeated description thereof is omitted.

As illustrated in FIG. 12, in the semiconductor power module 200, emitter wires EW1, EW2, and EW3 of transistor chips 1 to 3 that are different in collector potential are configured such that the number of emitter wires closer to an N terminal NT in a horizontal direction is smaller. That is, the number of emitter wires closer to the N terminal NT in the direction parallel to a long side of a resin case RC is smaller. More specifically, the number of emitter wires EW1 closest to the N terminal NT is smallest, and the number of emitter wires EW3 farthest from the N terminal NT is largest.

By making the number of emitter wires closer to the N terminal NT in the horizontal direction smaller, it is possible to make parasitic inductances uniform and make wiring inductances the same, thereby improving accuracy of overcurrent protection.

Third Preferred Embodiment

Figure 13:
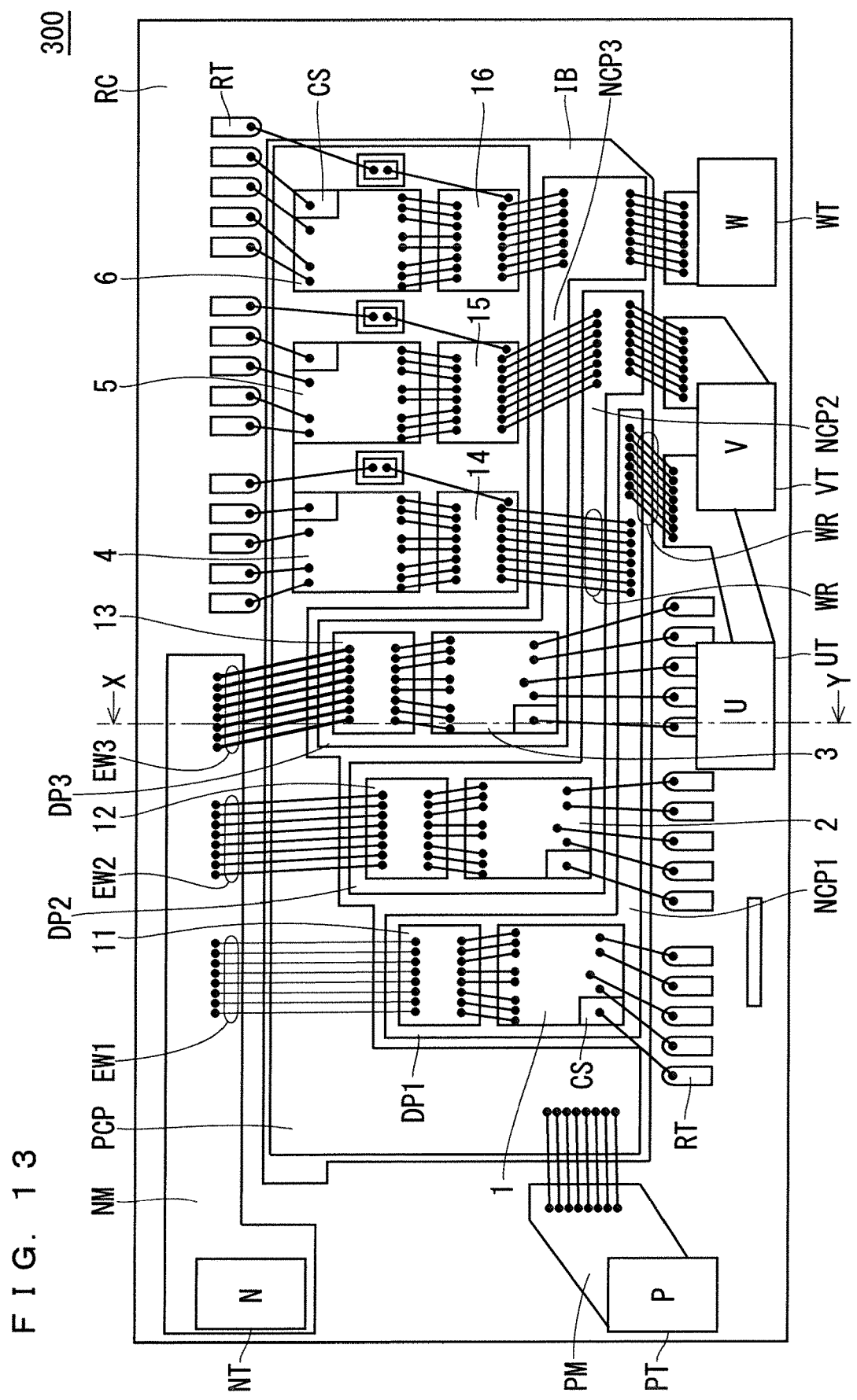
FIG. 13 is a plan view illustrating a configuration of a semiconductor power module according to a third preferred embodiment.

FIG. 13 is a plan view illustrating a configuration of a semiconductor power module 300 according to a third preferred embodiment of the present disclosure. Constituent elements identical to those of the semiconductor power module 100 according to the first preferred embodiment illustrated in FIG. 1 are given identical reference signs, and repeated description thereof is omitted.

As illustrated in FIG. 13, in the semiconductor power module 300, emitter wires EW1, EW2, and EW3 of transistor chips 1 to 3 that are different in collector potential are configured such that an emitter wire closer to an N terminal NT in a horizontal direction has a smaller diameter. That is, an emitter wire closer to the N terminal NT in the direction parallel to a long side of a resin case RC has a smaller diameter. More specifically, a diameter of the emitter wire EW1 closest to the N terminal NT is smallest, and a diameter of the emitter wire EW3 farthest from the N terminal NT is largest.

By making a diameter of an emitter wire closer to the N terminal NT in the horizontal direction smaller, it is possible to make parasitic inductances uniform and make wiring inductances the same, thereby improving accuracy of overcurrent protection.

Modifications

Although a case where a transistor chip that is a switching element and a diode chip that is a freewheeling element are separate chips is illustrated in the first to third preferred embodiments described above, a similar effect can be produced even in a case where a reverse conducting insulated gate transistor (RC-IGBT) in which a switching element and a freewheeling element are integrated into one chip is used.

The semiconductor of the switching element is not limited to silicon (Si), and a wide band gap semiconductor such as silicon carbide (SiC) or gallium nitride (GaN) can be used. A wide band gap semiconductor element using a wide band gap semiconductor can be reduced in size, has a good withstand voltage, has a high allowable current density, and has high heat resistance and therefore can operate at a high temperature as compared with a silicon semiconductor element.

Although an example in which wires are used as the emitter wires EW1 to EW3 has been described in the first to third preferred embodiments described above, ribbon wires may be used.

Fourth Preferred Embodiment

The present preferred embodiment is related to a power conversion apparatus to which any of the semiconductor power modules 100 to 300 according to the first to third preferred embodiments is applied.

Figure 14:
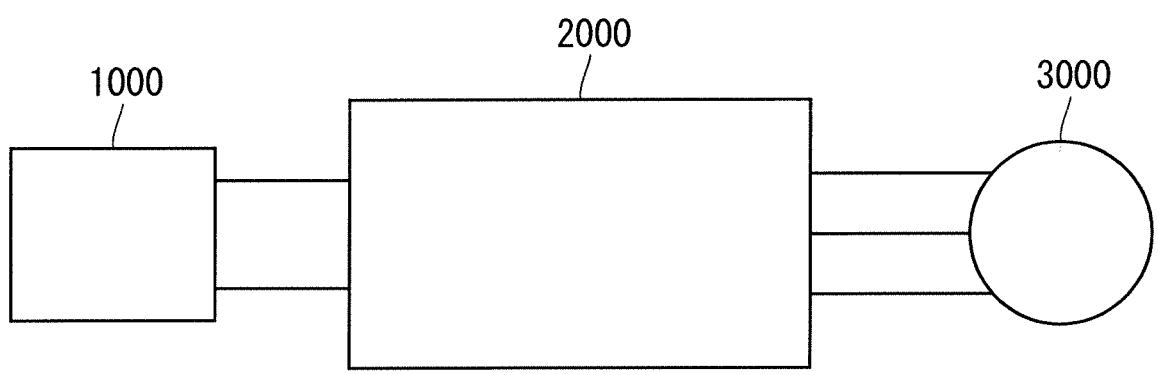
FIG. 14 is a block diagram illustrating a power conversion system according to a fourth preferred embodiment.

FIG. 14 is a block diagram illustrating a configuration of a power conversion system to which the power conversion apparatus according to the fourth preferred embodiment is applied.

The power conversion system illustrated in FIG. 14 includes a power supply 1000, a power conversion apparatus 2000, and a load 3000.

The power supply 1000 is a DC power supply, and supplies DC power to the power conversion apparatus 2000. The power supply 1000 can be any of various power supplies, and may be, for example, a DC system, a solar cell, or a rechargeable battery or may be a rectifier circuit and an AC/DC converter connected to an AC system. Alternatively, the power supply 1000 may be a DC/DC converter that converts DC power output from a DC system into predetermined power.

To the power conversion apparatus 2000, at least any one of the semiconductor power modules 100 to 300 according to the first to third preferred embodiments is applied. The U terminal UT, the V terminal VT, and the W terminal WT of the semiconductor power modules 100 to 300 are connected to the load 3000.

The load 3000 is a three-phase electric motor driven by AC power converted from DC power by the power conversion apparatus 2000. The load 3000 is not limited to a specific application and is an electric motor mounted on various electric devices, and is, for example, used as an electric motor for a hybrid vehicle, an electric vehicle, a railway vehicle, an elevator, or an air conditioner.

Since at least one of the semiconductor power modules 100 to 300 according to the first to third preferred embodiments is applied to the power conversion apparatus according to the present preferred embodiment, accuracy of overcurrent protection can be improved. Furthermore, the entire system can be reduced in size since the size of the semiconductor power module is reduced.

The embodiments of the present disclosure can be freely combined and changed or omitted as appropriate within the scope of the present disclosure.

While the disclosure has been shown and described in detail, the foregoing description is in all aspects illustrative and not restrictive. It is therefore understood that numerous modifications and variations can be devised.

What is claimed is:

1. A semiconductor power module comprising a three-phase AC inverter incorporated in a package, wherein
the three-phase AC inverter includes:
a first switching element and a second switching element connected in series, a third switching element and a fourth switching element connected in series, and a fifth switching element and a sixth switching element connected in series between a first main power supply line to which a first potential is applied and a second main power supply line to which a second potential lower than the first potential is applied, and
a first freewheeling element, a second freewheeling element, a third freewheeling element, a fourth freewheeling element, a fifth freewheeling element, and a sixth freewheeling element connected in antiparallel to the first to sixth switching elements, respectively, the semiconductor power module comprises:
a first circuit pattern, a second circuit pattern, a third circuit pattern on which the second, the fourth, and the sixth switching elements are mounted, respectively, and a fourth circuit pattern on which the first, the third, and the fifth switching elements are mounted;
a second main electrode to which all of main electrode wirings of the second, the fourth, and the sixth switching elements are connected;
a second main electrode terminal connected to the second main electrode;
a first main electrode electrically connected to the fourth circuit pattern; and
a first main electrode terminal connected to the first main electrode,
a first die pad, a second die pad, and a third die pad on which the second, the fourth, and the sixth switching elements of the first to third circuit patterns are mounted are arranged in a line in a direction along one side of the package so as to be parallel to each other,
the second main electrode is provided to extend along the one side,
the second main electrode terminal is provided at an end portion of the second main electrode in a direction in which the second main electrode extends in plan view, and
each of the main electrode wirings of the second, the fourth, and the sixth switching elements is provided so that a main electrode wiring closer to the second main electrode terminal in the horizontal direction in plan view has a longer length.

2. The semiconductor power module according to claim 1, wherein
the first die pad is closest to the second main electrode terminal in the horizontal direction in a plan view, the second die pad is second closest to the second main electrode terminal, and the third die pad is farthest from the second main electrode terminal, and the first to third die pads are provided in a shape of steps that descend toward the second main electrode terminal in plan view.

3. The semiconductor power module according to claim 1, wherein
the first to sixth switching elements have sense current terminals;
the semiconductor power module further comprises control circuit that control switching of the first to sixth switching elements, respectively; and
the control circuits have current sense terminals to which sense currents output from each of the sense current terminals of the first to sixth switching elements are input, and control switching of the first to sixth switching elements based on the input sense currents.

4. The semiconductor power module according to claim 1, wherein
the first main electrode terminal and the second main electrode terminal are provided adjacent to each other along another side orthogonal to the one side of the package.

5. The semiconductor power module according to claim 1, wherein
each of the main electrode wirings of the second, the fourth, and the sixth switching elements is provided so that a main electrode wiring closer to the second main electrode terminal in the horizontal direction in plan view has a smaller number of wires.

6. The semiconductor power module according to claim 1, wherein each of the main electrode wirings of the second, the fourth, and the sixth switching elements is provided so that a main electrode wiring closer to the second main electrode terminal in the horizontal direction in plan view has a smaller wire thickness.

7. The semiconductor power module according to claim 1, wherein the first to sixth switching elements are wide band gap semiconductor elements.

8. A power conversion apparatus comprising the semiconductor power module according to claim 1, wherein the power conversion apparatus converts and outputs input power.

\* \* \* \* \*